(12) United States Patent
Shiraishi et al.

(10) Patent No.: US 6,268,980 B1
(45) Date of Patent: *Jul. 31, 2001

(54) MAGNETIC HEAD APPARATUS WITH HEAD IC CHIP

(75) Inventors: Masashi Shiraishi; Masanori Sakai; Tsuyoshi Umehara; Haruyuki Morita; Ken-ichi Takano, all of Nagano (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,539

(22) Filed: Dec. 18, 1998

(30) Foreign Application Priority Data

Dec. 24, 1997 (JP) .................................................. 9-365967

(51) Int. Cl.$^7$ ...................................................... G11B 17/32
(52) U.S. Cl. ....................................................... 360/234.5
(58) Field of Search ...................................... 360/104–106, 360/234.5, 234.6, 234.7, 245.6, 245.7, 245.8

(56) References Cited

U.S. PATENT DOCUMENTS 5,901,017 * 5/1999 Sano et al. ..................... 360/234.5

FOREIGN PATENT DOCUMENTS

| 53-69623 | 6/1978 | (JP) . |
| 55-150130 | 11/1980 | (JP) . |
| 3-108120 | 5/1991 | (JP) . |

* cited by examiner

Primary Examiner—Allen T. Cao
(74) Attorney, Agent, or Firm—Arent Fox Kintner Plotkin & Kahn, PLLC

(57) ABSTRACT

A magnetic head apparatus includes a slider with at least one magnetic head element, a suspension having one end portion, one surface and connection pads formed on the one surface, for supporting the slider at the one end portion, a head IC chip flip chip bonded on the connection pads, and an overcoat layer formed on the one surface of the suspension to cover at least a part of each of the connection pads, the overcoat layer with anti-running structures for controlling flow of solder while the IC chip is flip chip bonded.

8 Claims, 3 Drawing Sheets

MAGNETIC HEAD APPARATUS WITH HEAD IC CHIP

FIELD OF THE INVENTION

The present invention relates to a magnetic head apparatus which includes a slider with at least one thin-film magnetic head element, a resilient suspension for supporting the slider and a head IC chip.

DESCRIPTION OF THE RELATED ART

In such magnetic head apparatus, the thin-film magnetic head element for writing magnetic information into and/or reading magnetic information from a magnetic recording medium such as a magnetic disk is in general formed on the slider flying in operation above the magnetic recording medium. The slider is supported by the suspension made of a resilient thin metal plate extended from one end of a movable arm of a magnetic disk drive unit.

The head IC chip is used for amplifying writing current to the magnetic head element, for amplifying reading current from the head element and for controlling the writing and reading operations of the head element. The head IC chip had been mounted on the movable arm located in a rearward position of the suspension or on a flexible printed cable (FPC) at a rearward position of the suspension. However, if the IC chip is mounted on the movable arm or on the FPC, lead lines for electrically connecting the magnetic head element with the IC chip become long causing noises to be easily generated. Also, the long lead lines provide some delay in rising and falling times of pulse signals due to parasitic capacitance and inductance of these lead lines causing the high rate transfer of data to make difficult.

In order to suppress the generation of noises from the lead lines, Japanese patent unexamined publications nos. 53(1978)-69623, 55(1980)-150130 and 3(1991)-108120 propose a magnetic head apparatus wherein the length of the lead lines is shortened by mounting the head IC chip on the slider or on the suspension.

However, if the IC chip is mounted on the slider or on the suspension, the IC chip itself is heated to a high temperature due to the writing current flowing through the IC chip during recording operation. This causes reliability of the head IC chip to lower. Therefore, how dissipate the generated heat from the head IC chip becomes very important.

The head IC chip is in general connected to pads formed on the suspension by flip chip bonding and C.T.E. (Coefficient of Thermal Expansion) of the IC chip and of the suspension differ with each other. Thus, if the IC chip is heated to the high temperature, the stress that is generated due to C.T.E. difference will not be sufficiently absorbed at the soldered bonding portion causing the remaining stress to directly apply to the head IC chip.

SUMMARY OF THE INVENTION

It is therefore an object of the present invention to provide a magnetic head apparatus, whereby stress generated due to increase in temperature of a head IC chip can be prevented from being applied to the head IC chip itself.

According to the present invention, a magnetic head apparatus includes a slider with at least one magnetic head element, a suspension having one end portion, one surface and connection pads formed on the one surface, for supporting the slider at the one end portion, a head IC chip flip chip bonded on the connection pads, and an overcoat layer formed on the one surface of the suspension to cover at least a part of each of the connection pads, the overcoat layer with anti-running structures for controlling flow of solder while the IC chip is flip chip bonded.

Since the overcoat layer with anti-running structures such as openings is formed on the suspension to cover a part of each of the connection pads, flow of the solder during flip chip bonding is controlled by the openings so as to prevent the solder from spreading out. Thus, the height and the shape of soldered bonding portions can be correctly controlled. In addition, since the overcoat layer with the openings is formed on the suspension to cover a part of each of the connection pads, the head IC chip disposed on the openings on the connection pads during the flip chip bonding is self-aligned due to the surface tension of the solder in liquid state. Namely, when the head IC chip is bonding, the surface tension of the solder in liquid state moves the head IC chip to the correct position so as to align the pads formed on the bottom of the head IC chip with the openings on the connection pads. Also, since the overcoat layer is formed on the suspension to cover a part of each of the connection pads, no shunt or no short-circuit problem of the connection pads on the suspension due to incorrect positioning of the pads of the head IC chip will occur.

As the height and the shape of soldered bonding portions are correctly controlled, the stress which is generated under high or low temperature due to C.T.E. difference between the head IC chip and the suspension can be sufficiently absorbed at the soldered bonding portions so as to prevent the stress to directly apply to the head IC chip. Also, since the height of the soldered bonding portions is correctly controlled, problems that the IC chip is mounted on the suspension at an angle and that the edge of the inclined head IC chip accidentally contacts with the conductors on the suspension can be prevented from occurring. Thus, correct and stable mounting of the head IC chip can be expected, and furthermore reliability for bonding by the soldered bonding portions extremely increases.

In addition, since outflow of solder from the bonding portions during the flip chip bonding is suppressed to ensure a sufficient height of the soldered bonding portions, a space is provided between the suspension and the head IC chip. Therefore, underfill with good heat conductivity (filler material with good heat conductivity) can be easily injected into the space so that heat generated from the IC chip can be easily dissipated through the underfill into the suspension to extremely improve heat radiation characteristics.

It is preferred that each of the anti-running structures of the overcoat layer is an opening formed at each of the connection pads. In this case, preferably, shape of the connection pad is a circle, and shape of the opening of the overcoat layer is a circle.

It is also preferred that the head IC chip has solder bumps, and that a diameter of the opening of the overcoat layer is larger than a diameter of each of the solder bumps. More preferably, the diameter of the opening of the overcoat layer is 120–150% of the diameter of each of the solder bumps.

It is preferred that the overcoat layer has a thickness of 5 μm or less. Thus, adequate flexibility for the suspension can be ensured. Also, the overcoat layer is preferably made of polyimide resin or high temperature endurance coating or film material.

It is also preferred that the apparatus further includes a resin layer with high heat conductivity filled between the suspension and the head IC chip.

By thus filling the high heat conductivity resin, heat generated from the IC chip can be easily dissipated through the resin layer into the suspension to extremely improve heat radiation characteristics. In addition, the filled resin layer improves not only mechanical strength of this portion but also reliability of the IC chip because the resin layer covers the bottom surface of the IC chip.

Further objects and advantages of the present invention will be apparent from the following description of the preferred embodiments of the invention as illustrated in the accompanying drawings.

DESCRIPTION OF THE PREFERRED EMBODIMENTS

Figure 1:
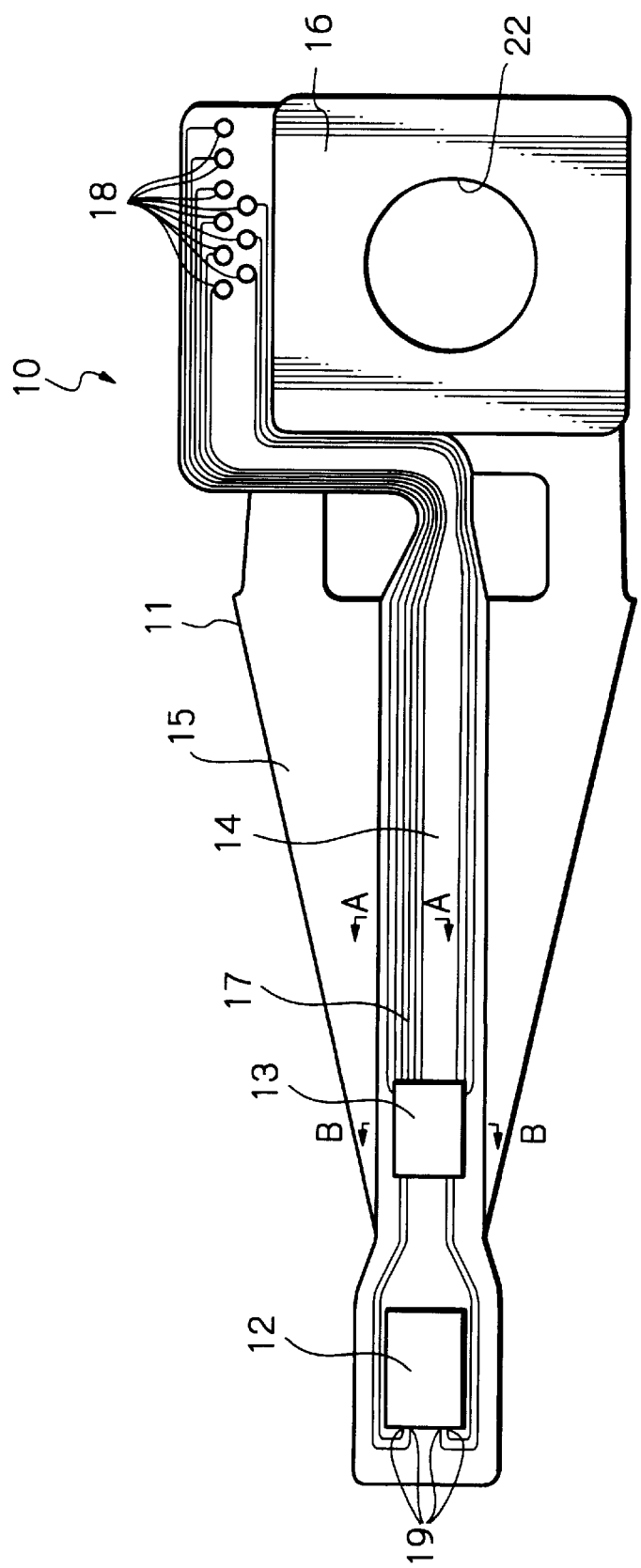
FIG. 1 shows a plane view, seen from a slider-attached surface side, of a preferred embodiment of a magnetic head apparatus according to the present invention.
Figure 2:
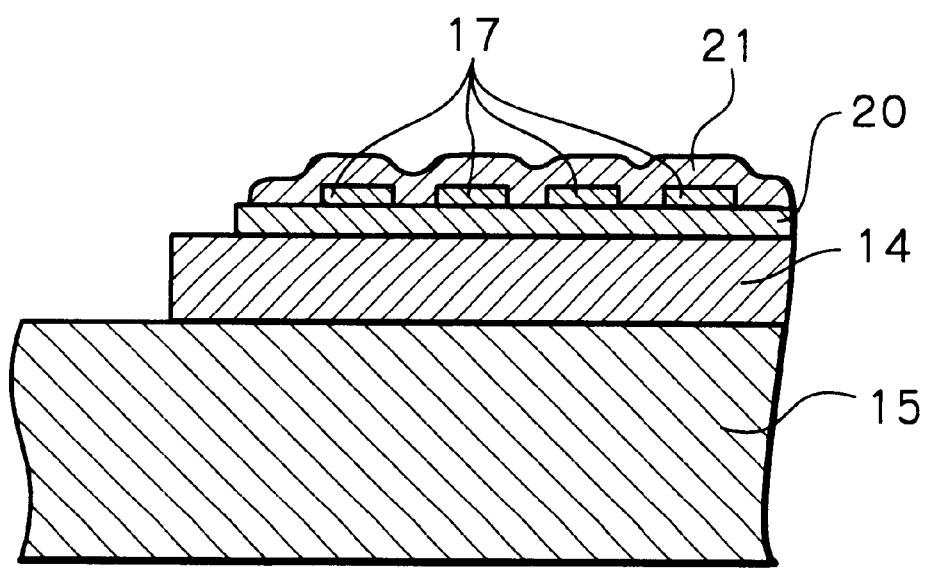
FIG. 2 shows a sectional view seen from A—A line of FIG. 1.

FIG. 1 illustrates a slider-attached surface of a magnetic head apparatus as a preferred embodiment of the present invention, and FIG. 2 illustrates an A—A line section of the apparatus.

In these figures, reference numeral 10 denotes a head-suspension assembly corresponding to the magnetic head apparatus according to the present invention. The head-suspension assembly is assembled by fixing a slider 12 having a magnetic head element to a top end portion of a suspension 11, and by mounting a head IC chip 13 on a middle portion of this suspension 11. The slider 12 and the head IC chip 13 are fixed on a surface of the suspension 11, which opposes to the magnetic disk surface. This surface of the suspension is called hereinafter as a slider-attached surface.

As shown in FIG. 1, the suspension 11 is substantially constituted by a resilient flexure 14 which carries the slider 12 at its tang located near its top end portion and supports the head IC chip 13 at its middle portion, a load beam 15 which supports and fixes the flexure 14, and a base plate 16 formed at a base end portion of the load beam 15.

The flexure 14 is made of in this embodiment a stainless steel plate (for example SUS304TA) with a thickness of about 25 μm.

A conductor layer of a thin-film pattern 17 that constitutes necessary number of lead lines is formed on the flexure 14 along its length. One end of the conductor layer 17 (the base plate 16 side) is connected to connection terminals 18 connected to external circuits, and the other end of the conductor layer 17 is connected to connection terminals 19 formed at the top end portion of the flexure 14.

The thin-film conductive pattern can be formed by a well-known method similar to the patterning method of forming a printed circuit board on a thin metal plate. Namely, as shown in FIG. 2, the conductive pattern is formed by sequentially depositing a first insulation material layer 20 made of a resin such as polyimide with a thickness of about 5 μm, a patterned Cu layer (conductive layer) 17 with a thickness of about 4 μm, and a second insulation material layer 21 made of a resin such as polyimide with a thickness of about 5 μm on the flexure 14 in this order. Within the regions of the connection terminals 18 and 19, a Ni layer and an Au layer are sequentially deposited on the Cu layer and there is no second insulation material layer 21. In order to easily understand the structure, the conductor layer 17 is indicated by solid lines in FIG. 1.

The load beam 15 is made of in this embodiment a stainless steel plate with a thickness of about 70–75 μm and supports the flexure 14 along its whole length. This load beam 15 has a shape with a width that narrows with approaching to its top end. Fixing of the flexure 14 to the load beam 15 is achieved by means of a plurality of welded spots.

The base plate 16 is made of a stainless steel or iron and is fixed to the base end portion of the load beam 15 by means of welded spots. The suspension 11 is attached to a movable arm (not shown) by fixing an attachment part of the base plate 16 to the movable arm. In modification, the head-suspension assembly may be formed in a two-pieces structure with a base plate and a flexure-load beam instead of the three-pieces structure with the flexure 14, the load beam 15 and the base plate 16.

As aforementioned, the slider 12 with the magnetic head element is mounted on the flexure 14 at the top end portion of the suspension 11. The conductor layer 17 which constitutes the necessary number of lead lines passes both sides of the slider 12 and turns back at the top end portion of the flexure 14 to the connection terminals 19 so as to electrically connect with input/output electrodes of the slider 12. The conductor layer 17 is covered by the insulation material layer made of the resin. In modification, a dimple may be formed between the load beam 15 and the flexure 14 at a position on which the slider 12 is mounted.

The head IC chip 13 is mounted on the slider-attached surface at the middle length portion of the suspension 11. The head IC chip 13 has preferably a lightweight of 1 mg or less. Thanks to the lightweight of the IC chip, even if the IC chip 13 is mounted on the suspension 11, it can be expected to produce little ill effect to mechanical resonance characteristics of this suspension 11.

The head IC chip 13 in this embodiment is formed by a bear chip and mounted on and connected to, by the flip chip bonding, the conductor layer 17 which is formed on the flexure 14 of the suspension 11 via the first insulation material layer 20.

Figure 3:
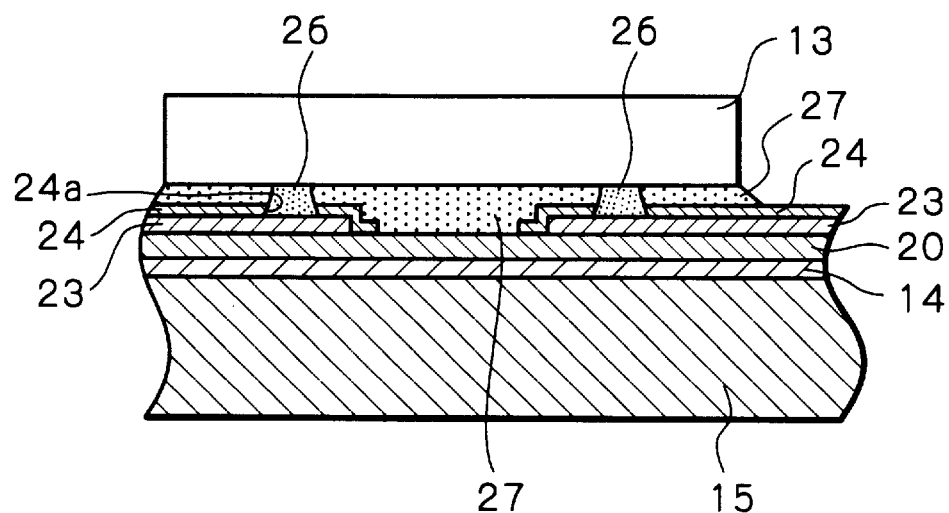
FIG. 3 shows a sectional view seen from B—B line of FIG. 1.
Figure 4:
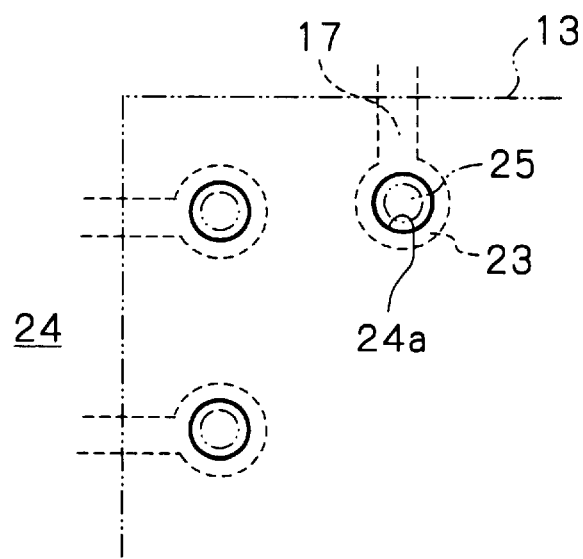
FIG. 4 shows a plane view illustrating a soldered bonding portion in the embodiment of FIG. 1.

FIG. 3 illustrates a B—B line section of the apparatus FIG. 1, and FIG. 4 illustrates a soldered bonding portion in the head IC chip 13.

As shown in FIG. 3, on connection pads 23 which are a part of the conductor layer 17 formed on the first insulation material layer 20, an overcoat layer 24 made of a resin such as polyimide or high temperature endurance coating or film material with a thickness of about 1–5 μm are multi-layered. The overcoat layer 24 has openings 24a at positions corresponding to soldering bumps 25 (FIG. 4) for the head IC chip 13.

As shown in FIG. 4, the diameter of each opening 24a is larger than, preferably 120–150% of, the diameter of the soldering bump 25. For example, in case of about 81 μm of the soldering bump diameter, the diameter of the opening 24a is about 120 μm. The opening 24a is preferred to shape in a circle as shown in FIG. 4 because the shape of the soldering bump 25 is sphere. However, the opening 24a can be made in another shape such as a polygon or an oblong. Also, The connection pad 23 is preferred to shape in a circle as shown in FIG. 4. However, the connection pad 23 can be made in another shape such as a polygon or an oblong.

Since the overcoat layer 24 with the openings 24a at positions of the soldering bumps 25 for the IC chip 13 is formed on the connection pads 23, flow of the solder during flip chip bonding is controlled by the openings 24a so as to prevent the solder from spreading out. Thus, the height and the shape of soldered bonding portions 26 can be correctly controlled.

In addition, since the overcoat layer 24 with the openings 24a is formed on the connection pads 23, the head IC chip 13 disposed on the openings 24a during the flip chip bonding is self-aligned due to the surface tension of the solder in liquid state. Namely, when the head IC chip 13 is bonding, the surface tension of the solder in liquid state moves the head IC chip 13 to the correct position so as to align pads formed on the bottom of the head IC chip 13 with the openings 24a on the connection pads 23. Also, since the overcoat layer 24 is formed on the suspension 11 to cover a part of each of the connection pads 23, no shunt or no short-circuit problem of the connection pads 23 on the suspension 11 due to incorrect positioning of the pads of the head IC chip 13 will occur.

Because the height and the shape of soldered bonding portions 26 are correctly controlled, the stress which is generated under high or low temperature due to C.T.E. difference between the head IC chip 13 and the suspension 11 can be sufficiently absorbed at the soldered bonding portions 26 so as to prevent the stress to directly apply to the head IC chip 13. Also, since the height of the soldered bonding portions 26 is correctly controlled, problems that the IC chip 13 is mounted on the suspension 11 at an angle and that the edge of the inclined head IC chip 13 accidentally contacts with the conductors on the suspension 11 can be prevented from occurring. Thus, correct and stable mounting of the head IC chip can be expected, and furthermore reliability for bonding by the soldered bonding portions 26 extremely increases. In addition, since the thickness of the overcoat layer 24 is 5 $\mu$m or less, adequate flexibility for the suspension can be ensured.

Since outflow of solder from the bonding portions 26 during the flip chip bonding is suppressed to ensure a sufficient height of the soldered bonding portions 26, for example about 50 $\mu$m, a space is provided between the first insulation material layer 20 on the flexure 14 and the bottom surface of the head IC chip 13. Therefore, an underfill (filler material) with good heat conductivity can be easily injected into the space to form an underfill layer 27. The underfill layer 27 will be made of mixture of a resin such as polyimide and insulation material with good heat conductivity. The underfill with good heat conductivity may be for example a resin containing fused silica (heat conductivity ratio of about $12\times10^{-4}$ cal/cm sec degrees), a resin containing alumina (heat conductivity ratio of about $40\times10^{-4}$ cal/cm sec degrees), a resin containing crystal silica (heat conductivity ratio of about $35\times10^{-4}$ cal/cm sec degrees), or a resin containing aluminum nitride (heat conductivity ratio of about $40\times10^{-4}$ cal/cm sec degrees).

By thus filling the underfill of a high heat conductivity resin, heat generated from the IC chip 13 can be easily dissipated through the filler material layer into the suspension 11 to extremely improve heat radiation characteristics. In addition, the underfill layer 27 improves not only mechanical strength of this portion but also reliability of the IC chip 13 because the layer 27 covers the bottom surface thereof.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetic head apparatus comprising:
    a slider with at least one magnetic head element;
    a suspension having an end portion for supporting said slider and connection pads formed on a surface of said suspension;
    a head IC flip chip bonded on said connection pads, said head IC flip chip including soldering bumps; and
    an overcoat layer made of resin formed on said surface of said suspension to cover at least a part of each of said connection pads, said overcoat layer having openings corresponding to and surrounding said soldering bumps on said connection pads to prevent solder from spreading out when said head IC flip chip is flip chip bonded.

2. The apparatus as claimed in claim 1, wherein each of said anti-running structures of the overcoat layer is an opening formed at each of said connection pads.

3. The apparatus as claimed in claim 2, wherein shape of said connection pad is a circle, and wherein shape of said opening of the overcoat layer is a circle.

4. The apparatus as claimed in claim 2, wherein said head IC chip has solder bumps, and wherein a diameter of said opening of the overcoat layer is larger than a diameter of each of said solder bumps.

5. The apparatus as claimed in claim 4, wherein the diameter of said opening of the overcoat layer is 120–150% of the diameter of each of said solder bumps.

6. The apparatus as claimed in claim 1, wherein said overcoat layer has a thickness of 5 $\mu$m or less.

7. The apparatus as claimed in claim 6, wherein said overcoat layer is made of polyimide resin.

8. The apparatus as claimed in claim 1, wherein said apparatus further comprises a resin layer with high heat conductivity filled between said suspension and said head IC chip.

* * * * *